United States Patent [19]

Iwanaga et al.

[11] Patent Number: 5,857,886
[45] Date of Patent: Jan. 12, 1999

[54] ORGANIC THIN FILM ELECTROLUMINESCENT DEVICE AND ITS MANUFACTURING METHOD

[75] Inventors: Hideaki Iwanaga, Umi-machi; Akira Gyoutoku, Kiyama-machi; Shintarou Hara, Fukuoka, all of Japan

[73] Assignee: Matsushita Electric Industrial Co., Ltd., Osaka, Japan

[21] Appl. No.: 810,598

[22] Filed: Feb. 28, 1997

Related U.S. Application Data

[62] Division of Ser. No. 501,579, Jul. 12, 1995, Pat. No. 5,710,484.

[30] Foreign Application Priority Data

Jul. 13, 1994 [JP] Japan .................................. 6-161185

[51] Int. Cl.$^6$ .................................................. H05B 33/14
[52] U.S. Cl. .................. 445/24; 445/58; 427/66
[58] Field of Search ................. 427/66; 445/24, 445/58

[56] References Cited

U.S. PATENT DOCUMENTS

| | | |
|---|---|---|
| 5,059,862 | 10/1991 | VanSlyke et al. . |
| 5,247,226 | 9/1993 | Sato et al. ............................. 313/504 |
| 5,306,572 | 4/1994 | Ohashi et al. . |
| 5,456,988 | 10/1995 | Sano et al. . |
| 5,540,999 | 7/1996 | Yamamoto et al. . |

FOREIGN PATENT DOCUMENTS

| | | |
|---|---|---|
| 4-129191 | 4/1992 | Japan . |
| 4132189 | 5/1992 | Japan . |
| 4-255692 | 9/1992 | Japan . |
| 5-121172 | 5/1993 | Japan . |

OTHER PUBLICATIONS

Appl. Phys. Lett. 51 (1987) 913, by C. W. Tang and S.A. VanSlyke, No Date.

Proceedings of the 41st General Conference of Applied Physics, No. 3, P1073, No Date.

*Primary Examiner*—Kenneth J. Ramsey
*Attorney, Agent, or Firm*—McDermott, Will & Emery

[57] ABSTRACT

The object of the present invention is to provide an organic thin film EL device that has an improved close adherence of a hole injection electrode to an organic thin film layer and a long life, maintaining uniform luminance and minimized performance deterioration over the lapse of time. The organic thin film EL device, which includes an electron injection electrode and a hole injection electrode with an organic thin film layer placed therebetween, has a part or the whole of the hole injection electrode formed of a carbon film. In addition, the carbon film is formed by a sputtering method.

5 Claims, 1 Drawing Sheet

1

ORGANIC THIN FILM ELECTROLUMINESCENT DEVICE AND ITS MANUFACTURING METHOD

This is a Divisional of U.S. patent application Ser. No. 08/501,579, filed Jul. 12, 1995, now U.S. Pat. No. 5,710,484.

BACKGROUND OF THE INVENTION

1. Field of the Invention

The present invention relates to an electrical light emitting device used in displays, backlighting for liquid crystal displays, light sources for indicators and optical communications or the like.

2. Description of the Related Art

An electroluminescent (abbreviated as EL hereafter) device is a light emitting device utilizing the light emitting phenomenon of solid fluorescent material under an application of an electric field, i.e. electroluminescence. At the present time, inorganic EL devices using inorganic material as the light-producing body have been successfully developed and used as EL devices in backlighting of liquid crystal displays, flat panel displays, and the like. However, the inorganic EL devices have such inherent defects as needing a high voltage of 100 V to 200 V for luminescence of the devices, difficulties in realizing color displaying or the like.

On the other hand, efforts in research of EL devices formed of organic material have been made for a long time, but such efforts have not materialized in commercialization of viable products due to inferior performance of the organic EL devices when compared with the inorganic EL devices. However, as appears in Appl. Phys. Lett. 51(1987) 913 by C. W. Tang and S. A. VanSlyke, an organic thin film EL device was proposed by Tangs and others in 1987.

More specifically, an organic EL device formed of two layers of organic material, a hole carrier layer and a light emitting layer, was able to operate under a DC voltage and produce high brightness luminance exceeding 1000 cd/m$^2$ with an application of a low voltage of less than 10 V. Since that time on, R&D activities for a successful commercialization of similar organic thin film EL devices of a multilayer structure have been carried out vigorously.

In connection with the foregoing organic EL devices, devices of various luminescent wavelengths including blue light that were difficult to produce in a form of inorganic EL devices have been realized through changing luminescent material and layer structures, thereby arousing interests in applying such EL devices to various light emitting products and full color displays.

However, due to the existence of many non-light-emitting spots on the luminant surface of the organic thin film EL devices available at present, it is rather difficult to obtain devices of uniform surface luminance, and also on account of a markedly increased number of non-light-emitting spots and a noticeable change in the brightness reduction observed over a long period the devices are kept long on the shelf or operated continuously, the EL devices that achieved a practical level in performance and usage have been not yet available.

The causes of the foregoing non-uniform luminance and performance deterioration over time may be attributed to lack of a sufficient adherence between the hole injection electrode and the organic thin film layer.

An effort to improve the adherence of the hole injection electrode to the organic thin film layer has been made by roughening the surface of the hole injection electrode through reverse sputtering or the like.

Although uniform luminance is improved for the initial period of operation through the foregoing attempt, such defects as an increase in non-light-emitting spots, when the device is kept long on the shelf and operated continuously, and a reduction in brightness, when the device is operated continuously, have not been corrected.

This is considered to be attributed to the poor adherence of the organic thin film layer, which is an organic substance, to the hole injection electrode, which is an inorganic substance, and also to peeling off of the organic thin film layer from the hole injection electrode when the device is kept long on the shelf or operated continuously because of an excessive difference in thermal expansion coefficient between both.

The object of the present invention is to provide an organic thin film EL device, and its manufacturing method, having uniform luminance and achieving a long life with a reduced change in performance over a long time period.

III. SUMMARY

An organic thin film EL device of the present invention comprises:

an organic thin film layer emitting light at an application of an electric field thereto;

an electron injection electrode formed or disposed one surface of the foregoing organic thin film layer; and a hole injection electrode which is formed on another surface of the foregoing organic thin film layer, and includes a carbon thin film.

Another embodiment of the invention is directed to an organic thin film El (electroluminescent) device comprising:

an organic thin film layer that emits light upon an application of an electric field thereto;

an electron injection electrode disposed on one surface of said organic thin film layer;

a carbon thin film disposed on another surface of said organic thin film layer; and a hole injection electrode formed on said carbon thin film.

Also, the manufacturing method for the organic thin film EL device of the present invention comprises the steps of:

forming an organic thin film layer which emits light at an application of an electric field;

forming an electron injection electrode on one surface of the foregoing organic thin film layer; and forming a hole injection electrode which is disposed on another surface of the foregoing organic thin film layer, and includes a carbon thin film formed by means of a sputtering method. The sputtering method may include sputtering of a carbon target.

In all embodiments of the invention, the one surface is preferably an upper surface and the other surface is preferably a lower surface of the organic thin film layer.

The organic thin film El device provides important advantage. The adherence of the organic thin film layer to the hole injection electrode is intensified, thereby realizing a uniformly luminescent device substantially without any non-light-emitting spots. Besides, degradation in performance over time, such as a reduction in luminance brightness and an increase in non-light-emitting spots experienced, when the device is kept for a long time on the shelf or operated continuously, is likely to be greatly reduced.

IV. BRIEF DESCRIPTION OF DRAWINGS

V. DETAILED DESCRIPTION OF THE INVENTION

Details of the present invention will be explained with the help of drawings as follows.

Figure 1:
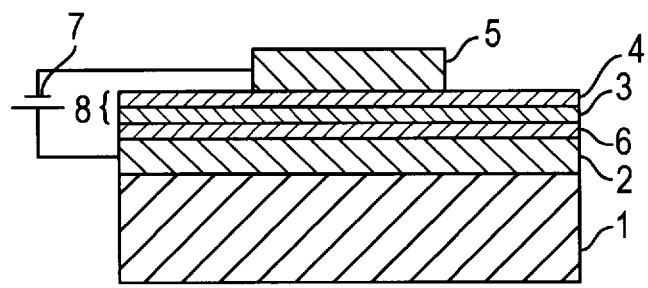
FIG. 1 is a cross-sectional view of an organic thin film EL device of a first exemplary embodiment of the present invention.

FIG. 1 is a cross-sectional view of an organic thin film EL device of a first exemplary embodiment of the present invention.

In FIG. 1, a positive hole injection electrode 2 is formed on the upper surface of a glass substrate 1.

On the upper surface of the hole injection electrode 2 is disposed a carbon thin film 6.

An organic thin film layer 8 comprising a hole carrier layer 3 and a light emitting layer 4 is formed on the upper surface of the carbon thin film 6.

On an area of the upper surface of the organic thin film layer 8 is formed an electron injection electrode 5. A power supply battery 7 is connected to the hole injection electrode 2 and the electron injection electrode 5.

In other words, the organic thin film layer 8 and the hole injection electrode 2 are joined together with the thin carbon film 6 placed therebetween.

As the hole injection electrode 2 is used a transparent electrode formed of such a material as indium tin oxide (ITO), indium oxide($In_2O_3$)/tin oxide(Sn $O_2$), tin oxide ($SnO_2$)/antimony(Sb), zinc oxide(ZnO)/aluminium(Al) or the like (i.e., similar materials).

The material for the hole carrier layer 3 is preferred to be of high hole mobility, readily film formable and of high transparency.

The foregoing material includes, for example as described in the Japanese Patent Placed Open to Public "TOKU-KAI-HEI-4-129191", such a polyphiline compound as porophin, tetraphenylporophin-copper, phthalocyanine, copper-phthalocyanine, titanium phthalocyanine oxide or the like, such an aromatic tertiary amine, such as 1,1-bis[4-(di-p-tolylamino) phenyl]cyclohexane, 4,4',4"-trimethyltriphenylamine, N,N,N',N"-tetrakis(P-tolyl)-P-phenylenediamine, 1-(N,N-di-P-tolylamino)naphthalene, 4,4'-bis(dimethylamino)-2,2'-dimethyltriphenylmethane, N,N,N',N'-tetraphenyl-4,4'-diaminobiphenyl, N,N'-diphenyl-N,N'-di-m-tolyl-4,N,N-diphenyl-N,N'-bis(3-methylphenyl)1,1'-4,4'-diamine, 4,4'-diaminobiphenyl, N-phenylcarbazole or the like, such a stilbene compound as 4-di-P-tolylaminostilbene, 4-(di-P-tolylamino)-4'-[4-(di-P-tolylamino)styryl]stilbene or the like, and triazole derivative, oxadiazole derivative, imidazole derivative, polyallylalkane derivative, pyrazoline derivative, pyrazolone derivative, phenylenediamine derivative, anylamine derivative, aminochalcone derivative, oxazole derivative, styrilanthracen derivative, fluorenone derivative, hydrazone derivative, silazane derivative, polysilane-aniline-copolymer, macromolecule oligomer, styrilamine, aromatic dimethylidene compound, poly-3-methyl thiophene or the like.

A hole carrier layer of polymer disperse system prepared by dispersing the foregoing hole carrier materials of low molecular-weight in high polymers such as polycarbonate and the like is also used.

A light emitting layer 4 can be formed of any kinds of fluorescent material that show a fluorescence in the visible region and can be easily made into a thin film.

As the material for the light emitting layer 4 there can be used a fluorescent brightening agent of benzothiazole group, benzoimidazole group, benzoxazole group or the like, a metal chelated oxinoide compound, a stylibenzene compound and the like, as described in the Japanese Patent Placed Open to Public "TOKU-KAI-HEI 4-255692".

Typical examples of the foregoing fluorescent brightening agents are a benzoxazole group including 2,5-bis(5,7-di-t-pentyl-2-benzoxazolyl)-1,3,4-thiadiazole, 4,4'-bis(5,7-pentyl-2-benzoazolyl)stilbene, 4,4'-bis[5,7-di-(2-methy 2-buthyl)-2-benzoxazolyl]stilbene, 2,5-bis(5,7-di-t-pentyl-2-benzoxazolyl)thiophene, 2,5-bis([5-a, a-dimethylbenzyl]-2-benzoxazolyl)thiophene, 2,5-bis[5,7-di-(2-methyl2-buthyl)-2-benzoxazolyl]-3,4-diphenyl-thiophene, 2,5-bis(5-methyl-2-benzoxazolyl)thiophene, 4,4'-bis(2-benzoxazolyl) biphenyl, 5-methyl-2-[2-[4-(5-methyl-2-benzoxazolyl) phenyl]vinyl] benzoxazole, 2-[2-(4-chlorophenyl) vinyl] naphtho[1,2-d] oxazole or the like, a benzothiazole group such as 2,2-(P-phenylenedivinylene)-bisbenzothiazole and the like, and a benzoimidazole group including 2-[2-[4-(2-benzoimidazolil)phenyl]vinyl]benzoimidazole, 2-[2-(4-calboxyphenyl) vinyl]benzoimidazole or the like.

As the typical metal chelated oxinoide compound of the foregoing there can be used a metal complex of 8-hydroxyquinoline group and the like such as tris(8-quinolinole)aluminum, bis(8-quinolinole)magnesium, bis (benzo[f]-8-quinolinole) zinc, bis(2-methyl-8-quinolilate) aluminiumoxide, tris(8-quinolinole)indium, tris(5-methyl-8-quinolinole)aluminium, 8-quinolinole lithium, tris(5-chloro-8-quinolinole)gallium, bis(5-chloro-8-quinolinole) calcium or the like.

As the styrylbenzene group compound there can be used 1,4-bis(2-methylstyryl)benzene, 1,4-bis(3-methylstyryl) benzene, 1,4-bis(4-methylstyryl)benzene, distyrylbenzene, 1,4-bis(2-ethylstyryl)benzene, 1,4-bis(3-ethylstyryl) benzene, 1,4-bis (2-methylstyryl)2-methylbenzene and the like.

As the light emitting layer there can also be used a distyrylpyrazine derivative such as 2,5-bis(4-methylstyryl) pyrazine, 2,5-bis (4-ethylstyryl)pyrazine, 2,5-bis[2-(1-naphthyl)vinyl] pyrazine, 2,5-bis(4-methoxystyryl) pyrazine, 2,5-bis[2-(4-biphenyl)vinyl]pyrazine, 2,5-bis[2-(1-pyrenyl)vinyl]pyrazine or the like.

Further, such derivatives as naphthal imide, perylene, oxadiazole, cyclopentadiene, styrylamine, coumarine and aromatic dimethylidine can also be used.

Still further, as described in the Japanese Patent Placed Open to Public "TOKU-KAI-HEI 4-132189", anthracene, salicylic acid salt, pyrene, colonene or similar compound can be used.

Also can be used such a compound as benzoquinolinole or the like as described in the Proceedings of the 41st General Conference of Applied Physics, No. 3, P1073.

As the electron injection electrode 5 there is generally used such metal as aluminum (Al), indium (In), magnesium (Mg), silver (Ag) or the like.

Particularly, such metal or alloy having small work function as Mg, Mg—Ag alloy, and aluminum (Al)-lithium (Li) alloy, strontium (Sr)-magnesium (Mg) alloy or the like as described in the Japanese Patent Placed Open to Public "TOKU-KAI-HEI 5-121172" are most suitable.

The carbon thin film 6 is a thin film formed of carbon, and is typically produced by means of sputtering of carbon. No particular restrictions are imposed on what kind of material is used as the carbon target, and isotropic graphite, anisotropic graphite, viterous carbon or similar materials are usually used. However, isotropic graphite of high purity is particularly considered to suit the purpose best.

In FIG. 1, a transparent hole injection electrode 2 is formed on the surface of a glass substrate 1. A carbon thin film 6 is disposed over the transparent hole injection electrode 2 by means of a sputtering method. Then, a hole carrier layer 3, a light emitting layer 4 and an electron injection electrode 5 are disposed sequentially and successively by means of a vacuum evaporation method. Thus, an organic thin film EL device is produced.

Figure 2:
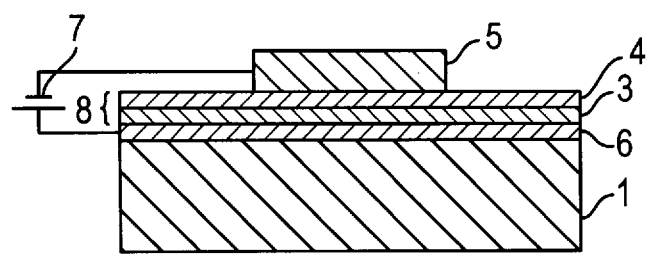
FIG. 2 is a cross-sectional view of an organic thin film EL device of a second exemplary embodiment of the present invention.

FIG. 2 is a cross-sectional view of an organic thin film EL device of a second exemplified embodiment of the present invention.

In FIG. 2, a carbon thin film 6 is formed on a glass substrate 1 by means of a sputtering method, and then a hole carrier layer 3, a light emitting layer 4 and an electron injection electrode 5 are disposed sequentially and successively by means of a vacuum evaporation method in the same way as shown in FIG. 1.

More specifically, an organic thin film layer 8 comprising a hole carrier layer 3 and a light emitting layer 4 is joined to a carbon thin film 6.

Accordingly, an organic thin film EL device is fabricated.

A power supply battery 7 is connected to a carbon thin film 6 and an electron injection electrode 5.

When a carbon thin film 6 is formed by means of a sputtering method in the production of an organic thin film EL device as shown in FIG. 1 or FIG. 2, reactive sputtering is performed in a gaseous atmosphere of nitrogen or hydrogen mixed with argon in order to control the electrical resistance of the carbon thin film 6.

Generally, when a thin film is formed by means of a sputtering method or the like, islands structures are present for the film thickness below 50 angstroms, thereby presenting difficulties in disposing a uniform thin film.

On account of this, electrical resistance becomes too high for electrical currents to flow for the film thickness below 50 angstroms. As a result, light does not emit. On the other hand, when the film thickness exceeds 1,000 angstroms, the color of the carbon thin film 6 becomes darker, resulting in a reduction of transmissivity for EL light through the glass surface.

Further, the construction of the organic thin film layer 8 of an organic thin film EL device of the present invention is applicable not only to the foregoing two-layer structure of the "hole carrier layer 3/light emitting layer 4", but also to a two-layer structure of a "light emitting layer/electron carrier layer" (not shown in drawings) or a three-layer structure of a "hole carrier layer/light emitting layer/electron carrier layer" and the like.

Next, details of the exemplified embodiments of the present invention will be explained.

EXAMPLE 1

By etching the surface of a commercially available glass substrate (Nippon Sheet Class Company's P110 E-H-PX) coated with indium tin oxide (ITO) by means of aqua regia, ITO's patterns were formed.

After an ultrasonic cleaning for an hour by use of a detergent (YuAi Chemicals' 14, White 7-L), another one hour ultrasonic cleaning by use of ion-exchange water, further ultrasonic cleaning for half an hour by use of acetone, still further one hour ultrasonic cleaning by use of ethanol, and a five minute immersion in ethanol had been applied to the etched substrate in succession, the cleaned substrate was left in air for self-drying.

After this step, the cleaned substrate was set up in the substrate holder of a DC magnetron sputtering apparatus (Aneluva's 730H).

Next, after a vacuum of as low as $8\times10^{-7}$ Torr max. had been produced inside the chamber, a carbon film was formed by carbon sputtering at a substrate temperature of 150° C. using a carbon target (Toyo Soda's) under an atmospheric 3 mm Torr pressure of a mixed gas of nitrogen (nitrogen 2.5%) and argon.

At this time, by controlling the sputtering time, five kinds of substrate for organic thin film EL devices, each having a film thickness of 50 angstroms, 100 angstroms, 500 angstroms, 1,000 angstroms and 1,200 angstroms, respectively, were produced as shown in Table 1.

Each respective substrate was taken out of the chamber, and then set up in the substrate holder of a resistance heating evaporation apparatus.

After a vacuum of as low as $1\times10^{-6}$ Torr max. had been produced inside the chamber, an evaporation process was performed to dispose a hole carrier layer 3 of about 500 angstroms in thickness by using N,N'-diphenyl-N,N'-bis(3-methylphenyl)-1,1'-diphenyl-4,4'-diamine as the evaporation source.

At this time, the evaporation speed was 3 angstroms/sec.

Then, by using tris(8-hydroxyquinoline) as the evaporation source, an evaporation process was performed to dispose a light emitting layer 4 of about 500 angstroms in thickness. At this time, the evaporation speed was about 2 angstroms/sec.

Next, by using Mg and Ag as the evaporation source for a resistance heating vacuum evaporation method, a cooperative evaporation process was performed to dispose an electron injection electrode 5 of about 2,500 angstroms in thickness.

At this time, the ratio of Mg deposition speed to Ag deposition speed was 10:1, and the evaporation speed was about 5 angstroms/sec.

Light emitting characteristics of the organic thin film EL devices thus obtained were measured with a DC voltage of 13 V applied across the ITO film serving as the anode and the Mg/Ag alloy film serving as the cathode. The measurement results are indicated in Table 1.

TABLE 1

| Carbon Film | Light Emitting Charact. (at 13 V) | | Continuous Run Test | |
|---|---|---|---|---|
| Thickness (angstrom) | Brightness (cd/m$^2$) | No Light Spot | Half Bright. Period (Hr) | No Light Spot |
| Example 1 | | | | |
| 50 | 1,800 | ◉ | 58 | ○ |
| 100 | 3,500 | ◉ | 130 | ○ |
| 500 | 5,800 | ◉ | 180 | ○ |
| 1,000 | 2,600 | ◉ | 120 | ○ |
| 1,200 | 1,300 | ◉ | 110 | ○ |
| Comparative Example 1 | | | | |
| 0 | 860 | Δ | 2 | X |

In Table 1, the symbol ◉ indicates 20 spots and less/10 mm$^2$, the symbol ○ indicates 20 to 50 spots/10 mm$^2$, the symbol Δ indicates 50 to 100 spots/10 mm$^2$ and the symbol X indicates 100 sport and more/10 mm$^2$.

The organic thin film EL device with a carbon thin film of 50 to 1,000 angstroms in thickness showed excellent luminance brightness and provided uniform green luminance without showing any non-light-emitting spots.

However, the organic thin film EL device with a carbon thin film of 1,200 angstroms in thickness showed reduced luminance brightness due to reduced transmissive in EL light.

Using each respective organic thin film EL device produced, continuous run tests were conducted with each device kept at an initial brightness of 500ʹ cd/m².

The test result was that the period for the brightness to decline to half its original value was 50 hours and more, and not much increase in the number of non-light-emitting spots was observed.

COMPARATIVE EXAMPLE 1

As a comparative example, an organic thin film EL device having no carbon thin film will be explained. According to the same production method as employed in Example 1 except for the sputtering process, an organic thin film EL device having no carbon film was produced.

Light emitting characteristics of the organic thin film EL devices thus obtained were measured with a DC voltage of 13 V applied across the ITO film serving as the anode and the Mg/Ag alloy film serving as the cathode. Also, continuous run tests were conducted.

The measurement results are also indicated in Table 1.

Many non-light-emitting spots were observed with this organic thin film EL device. Besides, the period for the luminance brightness to decline to half its original value was a very short period of 2 hours in a continuous run test. In addition, the non-light-emitting spots (dark spots) showed a greater increase in number, spreading all over the surface.

EXAMPLE 2

According to the same production process as employed in Example 1, various organic thin film EL devices were produced. However, such parameters as the carbon thin film thickness and the gas mixing ratio between nitrogen and argon for sputtering were different from those used in Example 1.

The carbon film thickness was the same 100 angstroms for all the organic thin film EL devices produced.

The carbon thin film for each respective device was formed with the nitrogen content ratio of the nitrogen and argon gas mixture adjusted to 0%, 2.5%, 10%, 50% and 100%, respectively.

Light emitting characteristics of the organic thin film EL devices thus obtained were measured with a DC voltage of 15 V applied across the ITO film serving as the anode and the Mg/Ag alloy film serving as the cathode.

Also, the period for the luminance brightness to be reduced to half its original value was measured while continuous run tests were conducted at an initial brightness of 500 cd/m². The measurement results are indicated in Table 2.

TABLE 2

| N₂ Content Ratio in Gas Mixture (%) | Light Emitting Charact. (at 15 V) | | Continuous Run Test | |
|---|---|---|---|---|
| | Brightness (cd/m²) | No Light Spot | Half Bright. Period (Hr) | No Light Spot |
| Example 2 | | | | |
| 0 | 3,800 | ⊚ | 43 | ○ |
| 2.5 | 8,600 | ⊚ | 160 | ○ |
| 10 | 7,800 | ⊚ | 180 | ○ |
| 50 | 6,500 | ⊚ | 130 | ○ |
| 100 | 3,200 | ⊚ | 50 | ○ |
| Comparative Example 2 | | | | |
| — | 2,100 | Δ | 2 | XX |

All the organic thin film EL devices produced had sufficient luminance brightness and provided uniform green luminance without showing any non-light-emitting spots. The period for the luminance brightness to decline to half its original value was 40 hours and more for all the devices and, particularly, the foregoing period of the device provided with a carbon thin film through the use of a gaseous mixture of nitrogen and argon was 100 hours and more. Besides, not much increase in the number of non-light-emitting spots was observed with all the organic thin film EL devices produced even after a continuous running test performed over the period for the luminance brightness to decline to half its original value.

COMPARATIVE EXAMPLE 2

For the purpose of comparison, an organic thin film EL device without any carbon thin film was prepared according to the production method similar to that used in Example 1.

Light emitting characteristics of the organic thin film EL device thus obtained were measured with a DC voltage of 15 V applied across the ITO film serving as the anode and the Mg/Ag alloy film serving as the cathode. Also, continuous run tests were conducted.

The measurement results are indicated in Table 2.

Many non-light-emitting spots were observed with this organic thin film EL device.

Besides, the period for the luminance brightness to be reduced to half its original value was a very short period of 2 hours in the continuous run test.

In addition, the non-light-emitting spots (dark spots) showed a greater increase in number, spreading all over the surface.

EXAMPLE 3

An organic thin film EL device was produced according to the same production method as used in Example 1 except for using a gaseous mixture of hydrogen (2.5% hydrogen) and argon to dispose a carbon thin film.

The thickness of the carbon thin film was 500 angstroms.

The obtained organic thin film EL device showed luminance brightness of 5,000 cd/m², and provided uniform luminance without showing any non-light-emitting spots.

The period for the luminance brightness to decline to half its original value was 110 hours in the continuous running test. Besides, not much increase in the number of non-light emitting spots was observed even after the continuous running test performed over the period for the luminance brightness to decline to half its original value.

COMPARATIVE EXAMPLE 3

For the purpose of comparison, an organic thin film EL device was prepared according to the same production method as used in Example 1 except for making the carbon thin film with a different thickness. The carbon thin film thickness of the resultant device was 30 angstroms.

A DC voltage of 25 V was applied to the obtained organic thin film EL device across the ITO serving as the anode and the Mg/Ag alloy serving as the cathode. However, the organic thin film EL device did not emit any light.

A continued application of the above voltage to the device finally resulted in an electrical breakdown of the device.

As explained in the foregoing, the construction of an organic thin film EL device as disclosed by the present invention makes it possible to provide uniform luminance without showing substantially any non-light-emitting spots. This is believed to be due to an improvement in a close adherence of the hole injection electrode to the organic thin film layer, and also to a marked decrease in deterioration in the light emitting characteristics of the organic thin film EL device when it is subjected to a continuous operation.

Of course, it should be understood that a wide range of changes and modifications can be made to the preferred embodiments described above. It is therefore intended that the foregoing detailed description be regarded as illustrative rather than limiting, and that it be understood that it is the following claims, including all equivalents, which are intended to define the scope of the invention.

What is claimed is:

1. A manufacturing method for an organic thin film EL device comprising the steps of:
   (a) forming a transparent electrode layer on a substrate,
   (b) forming a carbon thin film on said transparent electrode layer,
   (c) forming an organic thin film layer that emits light upon an application of an electric field, and
   (d) forming an electron injection electrode on said organic thin film layer, wherein said carbon thin film is disposed between said organic thin film layer and said transparent electrode layer.

2. A manufacturing method for an organic thin film EL device according to claim 1, wherein said carbon thin film is deposited by means of sputtering of a carbon target.

3. A manufacturing method for an organic thin film EL device according to claim 1, wherein a thickness of said carbon thin film ranges from 50 to 1,000 angstrom.

4. A method of manufacturing an organic thin film EL device comprising the steps of:

forming an organic thin film layer that emits light upon an application of an electric field thereto;

forming an electron injection electrode disposed on one surface of said organic thin film layer; and forming a transparent hole injection electrode that is disposed on another surface of said organic thin film layer, which transparent hole injection electrode includes a carbon thin film formed by means of sputtering of a carbon target.

5. A method of manufacturing an organic thin film EL device comprising the steps of:

forming an organic thin film layer that emits light upon an application of an electric field thereto;

forming an electron injection electrode disposed on one surface of said organic thin film layer; and forming a hole injection electrode that is disposed on another surface of said organic thin film layer, which hole injection electrode includes a carbon thin film formed by means of sputtering fo a carbon target, wherein said hole injection electrode is made of indium tin oxide, indium oxide/tin oxide, tin oxide/antimony or zinc oxide/aluminum.

* * * * *

UNITED STATES PATENT AND TRADEMARK OFFICE
CERTIFICATE OF CORRECTION

PATENT NO. : 5,857,886
DATED : January 12, 1999
INVENTOR(S) : IWANAGA et al.

It is certified that error appears in the above-identified patent and that said Letters Patent is hereby corrected as shown below:

Col. 10, l. 33: Change "fo" to --of--.

Signed and Sealed this

Fourteenth Day of December, 1999

Attest:

Q. TODD DICKINSON

Attesting Officer

Acting Commissioner of Patents and Trademarks